United States Patent
Terashima et al.

(10) Patent No.: US 8,053,910 B2
(45) Date of Patent: Nov. 8, 2011

(54) SUBSTRATE INCLUDING ALIGNMENT COLUMNAR MEMBER AND PLURAL PROTECTION COLUMNAR MEMBERS, AND METHOD OF MAKING THE SAME

(75) Inventors: Tomoyuki Terashima, Tokyo (JP); Hirokazu Uchida, Saitama (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 138 days.

(21) Appl. No.: 12/478,016

(22) Filed: Jun. 4, 2009

(65) Prior Publication Data

US 2009/0302486 A1    Dec. 10, 2009

(30) Foreign Application Priority Data

Jun. 9, 2008    (JP) .................. 2008-150644

(51) Int. Cl.
*H01L 23/544* (2006.01)
*H01L 21/76* (2006.01)
(52) U.S. Cl. .................. 257/797; 438/401; 438/462
(58) Field of Classification Search .......... None
See application file for complete search history.

(56) References Cited

U.S. PATENT DOCUMENTS

2004/0238973 A1* 12/2004 Wakisaka et al. ............ 257/796
2007/0164432 A1* 7/2007 Wakisaka et al. ............ 257/737

FOREIGN PATENT DOCUMENTS

JP    2007116203 A  *  5/2007
JP    2007-220870        8/2007

* cited by examiner

*Primary Examiner* — Alonzo Chambliss
(74) *Attorney, Agent, or Firm* — Volentine & Whitt, PLLC

(57) ABSTRACT

To provide a semiconductor substrate whose columnar member for alignment is difficult to fall off and a manufacturing method thereof. An alignment mark 24 (columnar member for alignment) and protection posts 26 surrounding the alignment mark 24 to protect the alignment mark are disposed in an alignment mark forming region 14 of a semiconductor wafer 101 (semiconductor substrate). Each of the protection posts has a diameter (maximum diameter) of, for example, 0.6 μm. The protection posts 26 are arranged such that the diameter of each of the columnar protection posts 26 is greater than a diameter (for example, 0.2 μm) of the alignment mark 24. That is, the protection posts 26 are arranged such that the contact area between each of the protection posts 26 and an underlayer thereof (dummy wire layer 22) is greater than the contact area between the alignment mark 24 and an underlayer thereof (dummy wire layer 22).

11 Claims, 6 Drawing Sheets

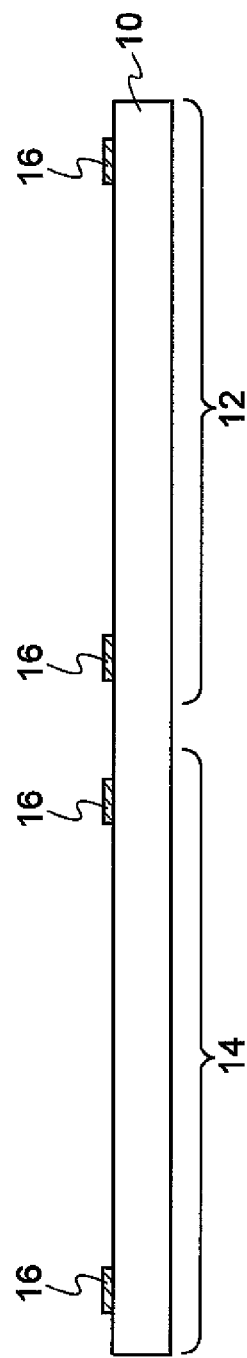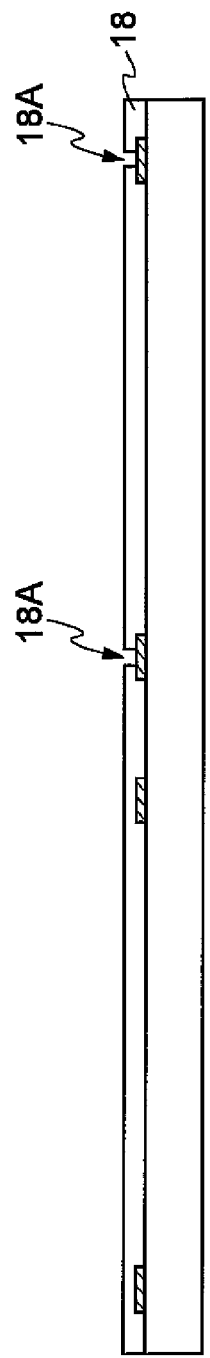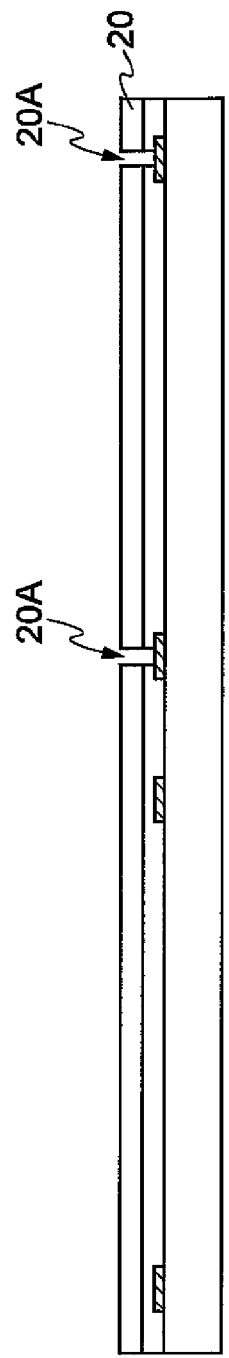
FIG. 4A
FIG. 4B
FIG. 4C

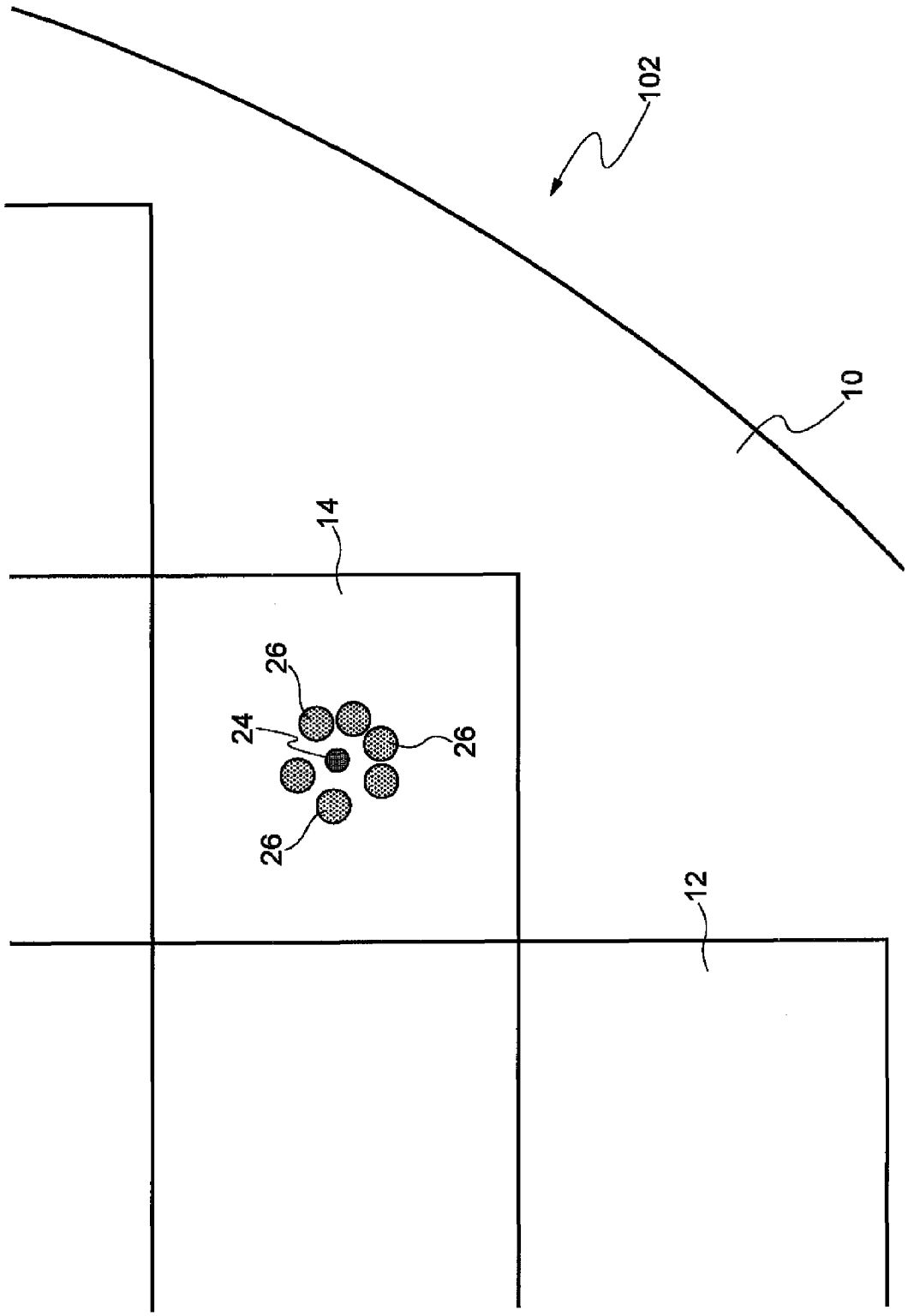

SUBSTRATE INCLUDING ALIGNMENT COLUMNAR MEMBER AND PLURAL PROTECTION COLUMNAR MEMBERS, AND METHOD OF MAKING THE SAME

BACKGROUND OF THE INVENTION

1. Field of the Invention

The present invention generally relates to a semiconductor substrate, that is referred to as a semiconductor wafer, having a plurality of semiconductor elements formed thereon in a batch manner such that the semiconductor elements are later separated from one another by dicing to obtain individual elements, and also relates to a manufacturing method thereof.

2. Description of the Related Art

On a semiconductor substrate referred to as a semiconductor wafer, a plurality of semiconductor elements are formed in a batch manner and are then separated from one another by dicing to obtain individual elements. At the time of dicing, it is necessary to perform alignment. To this end, an alignment mark (symbol-impressing: columnar member) is provided on the semiconductor substrate (for example, Patent document 1).

Patent document 1: Japanese Patent Application Kokai (Laid-Open) No. 2007-220870

SUMMARY OF THE INVENTION

If the columnar member for alignment, as the alignment mark, should be disposed on the semiconductor substrate, however, the alignment mark often falls due to external factors (for example, impacts by wafer tweezers or during transportation) when the alignment mark is provided on the semiconductor substrate.

Therefore, it is an object of the present invention to provide a semiconductor substrate whose columnar member for alignment is difficult to fall, and to provide a manufacturing method thereof.

According to a first aspect of the present invention, the above-mentioned object is accomplished by provision of a semiconductor substrate that includes a semiconductor substrate main body having a semiconductor element(s) formed therein (thereon), a columnar member for alignment disposed on the semiconductor substrate main body, and a plurality of columnar members for protection disposed on the semiconductor substrate main body such that the columnar members for protection surround the columnar member for alignment, to protect the columnar member for alignment, wherein a contact area between each of the columnar members for protection and an underlayer thereof is greater than a contact area between the columnar member for alignment and an underlayer thereof.

Each of the columnar members for protection may have a diameter greater than a diameter of the columnar member for alignment.

The columnar member for alignment may be disposed at an edge side of the semiconductor substrate, and those columnar members for protection which are disposed on the edge side of the semiconductor substrate have smaller arrangement pitches than those columnar members for protection which are disposed on an inner side of the semiconductor wafer.

According to a second aspect of the present invention, the above-mentioned object is achieved by provision of a method of manufacturing a semiconductor substrate that includes the step of preparing a semiconductor substrate main body having a semiconductor element(s) formed therein (thereon), the step of forming a columnar member for alignment on the semiconductor substrate main body, and the step of forming a plurality of columnar members for protection on the semiconductor substrate main body such that the columnar members for protection surround the columnar member for alignment while a contact area between each of the columnar members for protection and an underlayer thereof is greater than a contact area between the columnar member for alignment and an underlayer thereof, to protect the columnar member for alignment.

The step of forming the columnar members for protection may include forming the columnar members for protection such that each of the columnar members for protection has a diameter greater than a diameter of the columnar member for alignment.

The step of forming the columnar member for alignment may include forming the columnar member for alignment at an edge side of the semiconductor substrate, and the step of forming the columnar members for protection may include forming the columnar members for protection such that those columnar members for protection which are formed at the edge side of the semiconductor substrate have smaller arrangement pitches than those columnar members for protection which are disposed at an inner side of the semiconductor wafer.

The present invention therefore provides the semiconductor substrate that has the alignment columnar member difficult to fall therefrom and the manufacturing method thereof.

BRIEF DESCRIPTION OF THE DRAWINGS

FIGS. 4(A) to 4(C) are process diagrams illustrating the manufacturing method of the semiconductor wafer according to the first embodiment of the present invention;

FIG. 6 is a schematic plan view illustrating an alignment mark forming region of a semiconductor wafer according to a second embodiment of the present invention.

DETAILED DESCRIPTION OF THE INVENTION

Figure 1:
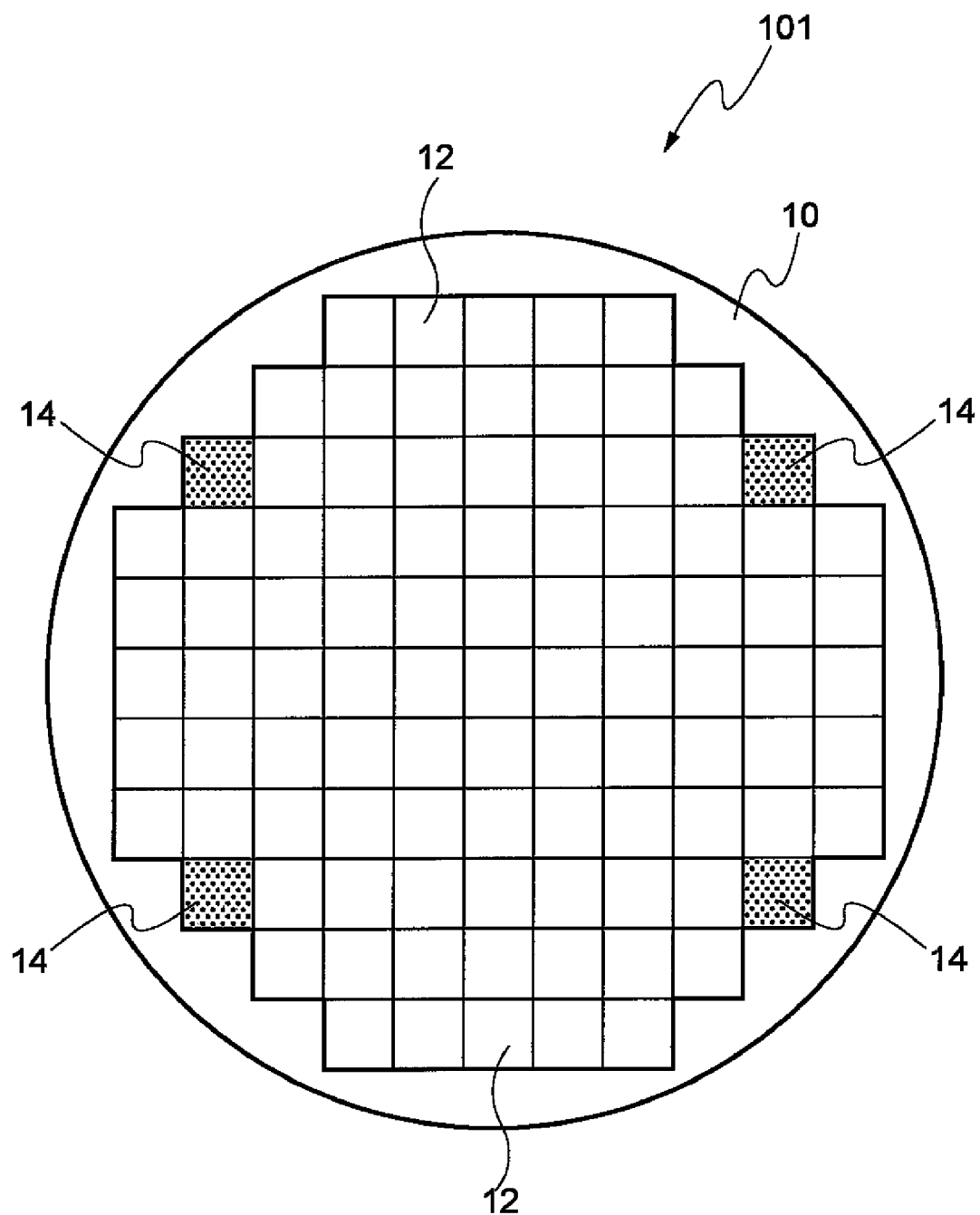
FIG. 1 is a schematic plan view illustrating a semiconductor wafer (semiconductor substrate) according to a first embodiment of the present invention.

Now, exemplary embodiments of the present invention will be described in detail with reference to the accompanying drawings. In the drawings, members having substantially the same function and operation are denoted by the same reference numerals and symbols even though they are depicted in different drawings, and a repetitious description thereof may not be given.

First Embodiment

Figure 2:
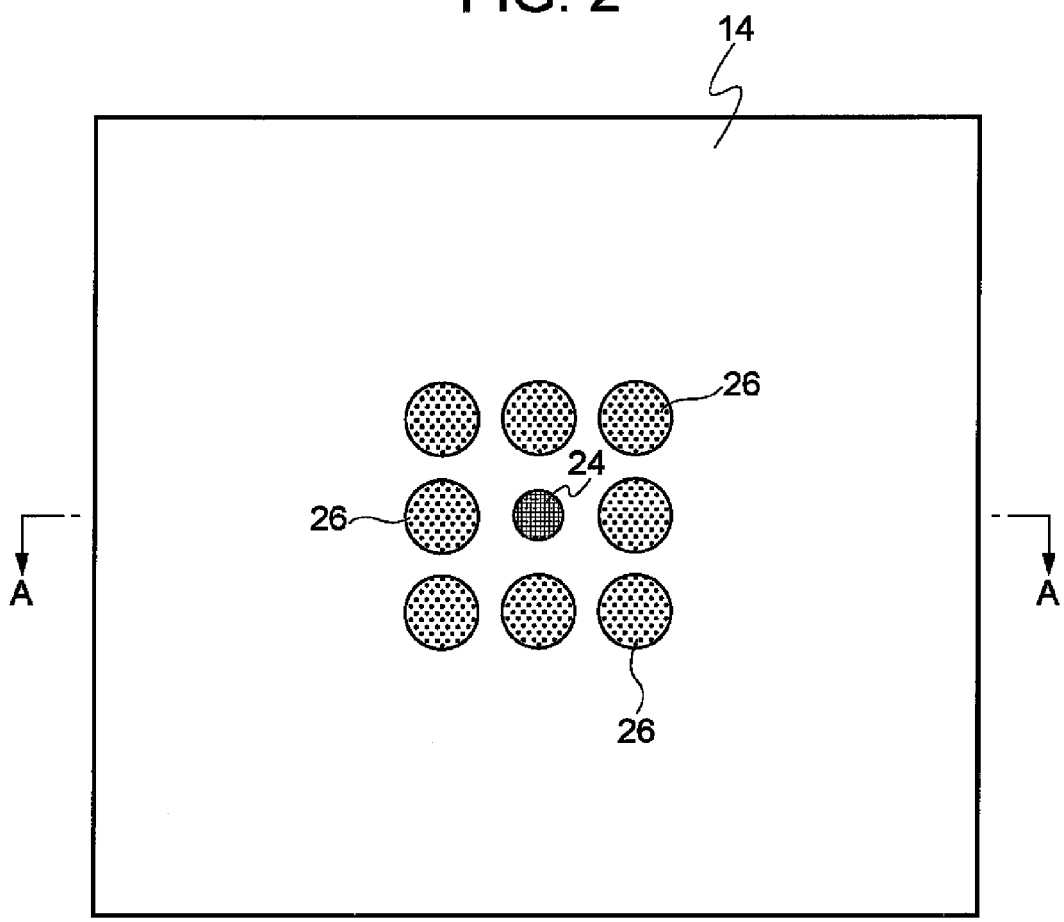
FIG. 2 is a schematic plan view illustrating an alignment mark forming region of the semiconductor wafer according to the first embodiment of the present invention.
Figure 3:
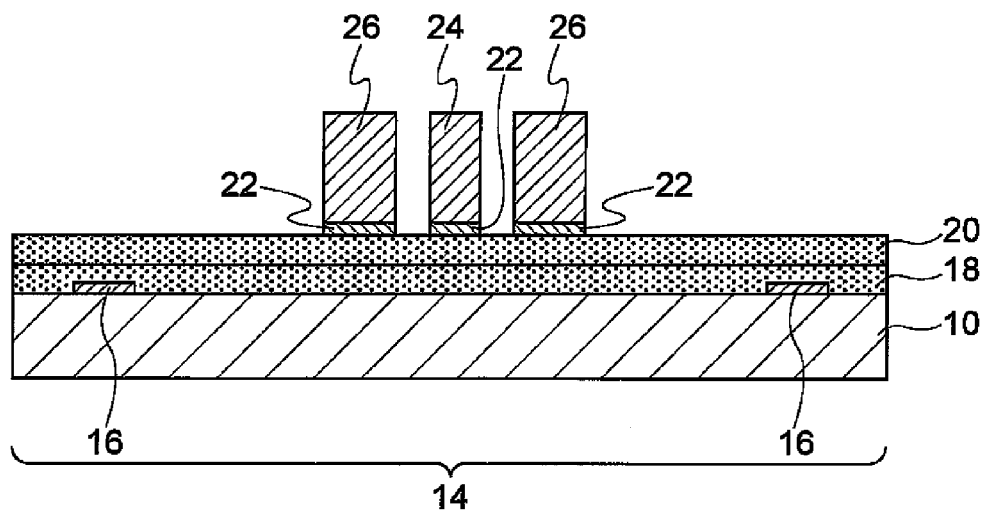
FIG. 3 is a schematic cross-sectional view taken along the line A-A in FIG. 2, illustrating the alignment mark forming region of the semiconductor wafer according to the first embodiment of the present invention.

FIG. 1 is a schematic plan view illustrating a semiconductor wafer (semiconductor substrate) according to a first embodiment of the present invention. FIG. 2 is a schematic plan view illustrating an alignment mark forming region of the semiconductor wafer according to the first embodiment of the present invention. FIG. 3 is a schematic sectional view taken along line A-A of FIG. 2, illustrating the alignment mark forming region of the semiconductor wafer according to the first embodiment of the present invention.

As shown in FIG. 1, the semiconductor wafer 101 (semiconductor substrate) according to the first embodiment of the present invention includes semiconductor element forming regions 12 each having a semiconductor element (integrated circuit having a predetermined function: not shown) formed therein and alignment mark forming regions 14 each having a columnar alignment mark (columnar member for alignment) formed therein. The semiconductor element forming regions 12 and the alignment mark forming regions 14 are disposed on a disc-shaped silicon substrate 10 (semiconductor substrate main body).

Each of the semiconductor element forming regions 12 is, for example, a rectangular or square region. The semiconductor element forming regions 12 are partitioned on the silicon substrate 10 in the shape of a lattice. Each of the alignment mark forming regions 14 has the same plane size as each of the semiconductor element forming regions 12. The alignment mark forming regions 14 are arbitrary regions defined on the silicon substrate 10 in the shape of square pieces of the lattice. The alignment mark forming regions 14 are disposed adjacent to particular semiconductor element forming regions 12. Boundaries to divide the semiconductor element forming regions 12 and the alignment mark forming regions 14 in the shape of a lattice are dicing lines.

In the illustrated embodiment, the alignment mark forming regions 14 are provided at four corner pieces of the lattice formed on the silicon substrate 10 among those which are nearest to the edge of the semiconductor substrate 101 (semiconductor wafer). It should be noted that the locations of the alignment mark forming regions 14 are not particularly restricted. For example, the alignment mark forming regions 14 may be disposed at arbitrary positions depending upon the structure of a dicing apparatus that cuts the semiconductor wafer into elements.

In each of the alignment mark forming regions 14, as shown in FIGS. 2 and 3, for example, a semiconductor element (integrated circuit having a predetermined function: not shown) is formed on an upper surface of the disc-shaped silicon substrate 10, and, connection pads 16 electrically connected to the semiconductor element are also formed on the upper surface of the disc-shaped silicon substrate 10, in the same manner as each of the semiconductor element forming regions 12. Further, in each of the alignment mark forming regions 14, for example, a passivation film 18 and a protective film 20, as insulation layers to cover the semiconductor element and the connection pads 16, are successively stacked on top of the disc-shaped silicon substrate, and a dummy wire layer 22 is formed on the insulation layer (protective film 20) such that the dummy wire layer 22 is not connected to the connection pads 16. It should be noted that although not shown, the dummy wire layer 22 is formed on the insulation film (protective film 20) via an underlayer.

In each of the alignment mark forming regions 14, for example, a columnar alignment mark 24 (columnar member for alignment) is disposed on the insulation film (protective film 20) at the center of each of the alignment mark forming regions 14 via the dummy wire layer 22. That is, the alignment mark 24 is disposed directly on the dummy wire layer 22. In addition, column protection posts 26 are disposed around the alignment mark 24 to protect the alignment mark. The protection posts 26 are arranged such that the protection posts 26 are not in contact with the alignment mark 24, i.e., such that each of the protection posts 26 is spaced apart from the alignment mark 24 by a predetermined distance (for example, approximately 200 μm).

In this embodiment, six protection posts 26 are provided around the alignment mark 24. More specifically, the protection posts 26 are disposed in a 3×3 matrix (the center thereof is the alignment mark 24) having the equal arrangement pitch (arrangement interval) such that the alignment mark 24 is located at the center of the protection posts 26.

Each of the protection posts 26 is formed in the shape of a column or cylinder having a diameter (maximum or outer diameter) of, for example, 400 μm. The protection posts 26 are provided such that the diameter of each of the cylindrical protection posts 26 is greater than a diameter (for example, 200 μm) of the cylindrical alignment mark 24. That is, the protection posts 26 are arranged such that the contact area between each of the protection posts 26 and the underlayer thereof (dummy wire layer 22) is greater than the contact area between the alignment mark 24 and the underlayer thereof (dummy wire layer 22).

It should be noted that the "diameters" of the protection posts 26 and the alignment mark 24 are diameters measured in a plane perpendicular to the longitudinal direction of the protection posts 26 and the alignment mark 24.

Now, a manufacturing method of the semiconductor wafer according to this embodiment will be described. FIGS. 4(A)-4(C) and 5(A)-5(C) are a series of process diagrams illustrating a manufacturing method of the semiconductor wafer according to the first embodiment of the present invention. In this process, not only a process for manufacturing the alignment mark forming regions 14 but also a process for manufacturing the semiconductor element forming regions 12 will be described.

First, as shown in FIG. 4(A), a silicon substrate 10 is prepared. A plurality of regions are defined on the silicon substrate 10 in the shape of a lattice. A semiconductor element (not shown) is formed on the silicon substrate 10 in each of the partitioned regions by a semiconductor process. Application of a resist, exposing, and etching are carried out on the silicon substrate 10 to form a mask, and then connection pads 16 made of aluminum are formed on the silicon substrate 10 by sputtering or plating. As a result, alignment mark forming regions 14 and semiconductor element forming regions 12 are formed.

Subsequently, as shown in FIG. 4(B), a passivation film 18 is formed over the silicon substrate 10 having the semiconductor element and the connection pads 16 formed thereon in the alignment mark forming region 14 and the semiconductor element forming region 12 such that the semiconductor element and the connection pads 16 are covered with the passivation film 18 (i.e., such that the entirety of the silicon substrate 10 is covered with the passivation film 18). In the semiconductor element forming region 12, the passivation film 18 is formed, but openings 18A are also formed to partly expose the connection pads 16.

The passivation film 18 is a silicon nitride film formed of $SiH_4$, $NH_3$ and $N_2$ as raw material gases, for example, by chemical vapor deposition using plasma. The openings 18A of the passivation film 18 are formed, for example, by applying, exposing, and etching a resist on the passivation film 18 to form a mask and etching the passivation film 18.

Subsequently, as shown in FIG. 4(C), a protective film 20 is formed over the silicon substrate 10 having the passivation film 18 thereon in the alignment mark forming region 14 and the semiconductor element forming region 12 such that the protective film 20 is layered over the passivation film 18. In the semiconductor element forming region 12, the protective film 20 is formed, but openings 20A are also formed in the protective film 20 to partially expose the connection pads 16 (such that the openings 20A communicate with the openings 18A of the passivation film 18).

The protective film 20 is formed of an epoxy resin film, for example, by chemical vapor deposition using plasma. The openings 20A of the protective film 20 are formed, for example, by applying, exposing, and etching a resist on the protective film 20 to form a mask and etching the protective film 20.

Figure 5A:
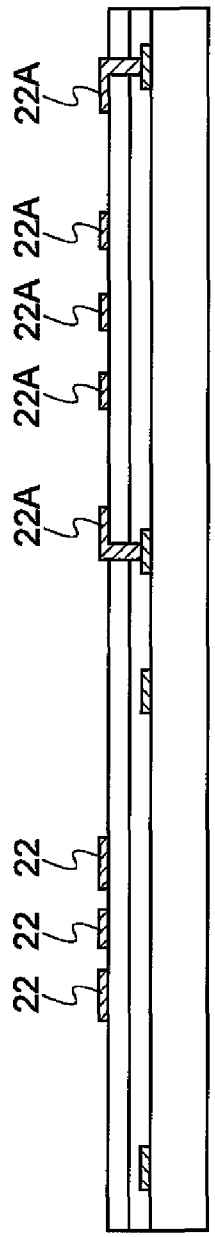
FIGS. 5(A) to 5(C) are process diagrams illustrating a manufacturing method of the semiconductor wafer according to the first embodiment of the present invention.

Subsequently, as shown in FIG. 5(A), a resist is applied, exposed, and etched on the protective film 20 in the alignment mark forming region 14 and the semiconductor element forming region 12 to form a mask, and then a metal layer made of copper is formed on the protective film 20 by sputtering or plating.

In the alignment mark forming region 14, the metal layer is formed on the protective film 20, such that the metal layer is pulled around while the metal layer is not in contact with the connection pads 16, to constitute a dummy wire layer 22. In the semiconductor element forming region 12, on the other hand, the metal layer is electrically connected to the connection pads 16 through the openings 20A of the protective film 20 and the openings 18A of the passivation film 18, and, at the same time, is formed on the protective film 20, such that the metal layer is pulled around, to constitute a rewire layer 22A.

Figure 5B:
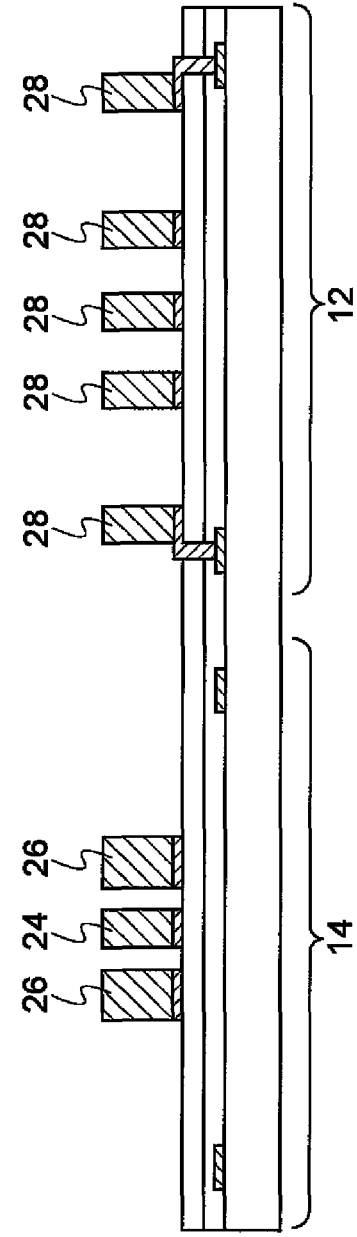

Subsequently, as shown in FIG. 5(B), a resist is applied, exposed, and etched on the rewire layer 22A and the dummy wire layer 22 in the alignment mark forming region 14 and the semiconductor element forming region 12 to form a mask, and then metal posts made of copper are formed on the rewire layer 22A and the dummy wire layer 22 by sputtering or plating.

In the alignment mark forming region 14, the metal posts are not in contact with the connection pads 16. Consequently, these metal posts serve as dummy post electrodes, which are used as an alignment mark 24 and protection posts 26. In the semiconductor element forming region 12, on the other hand, the metal posts serve as post electrodes 28 electrically connected to the connection pads 16.

A semiconductor wafer 101 according to this embodiment is obtained through the above-described process.

Figure 5C:
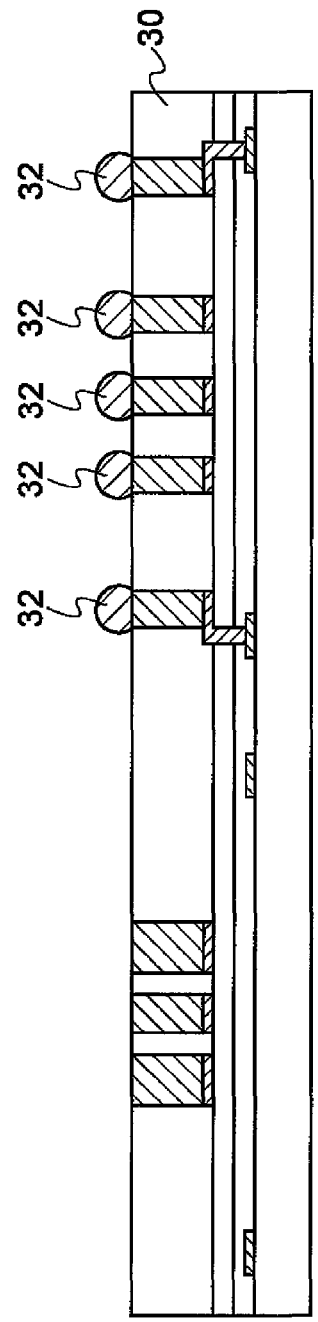
Figure 5D:
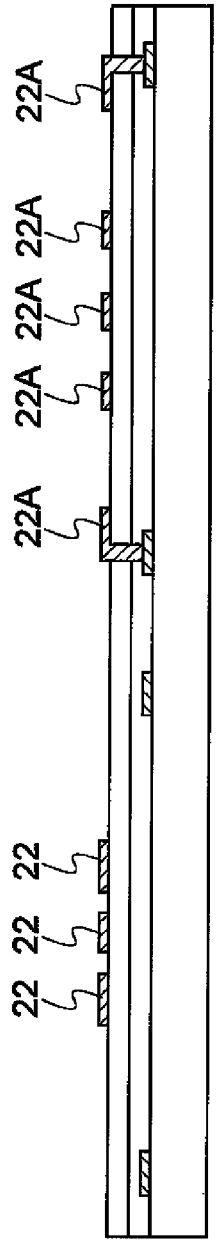
Figure 5E:
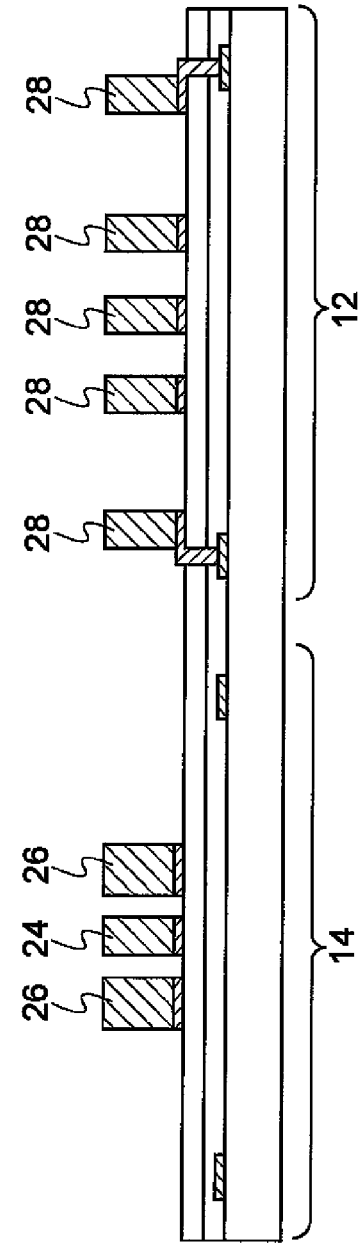
Figure 5F:
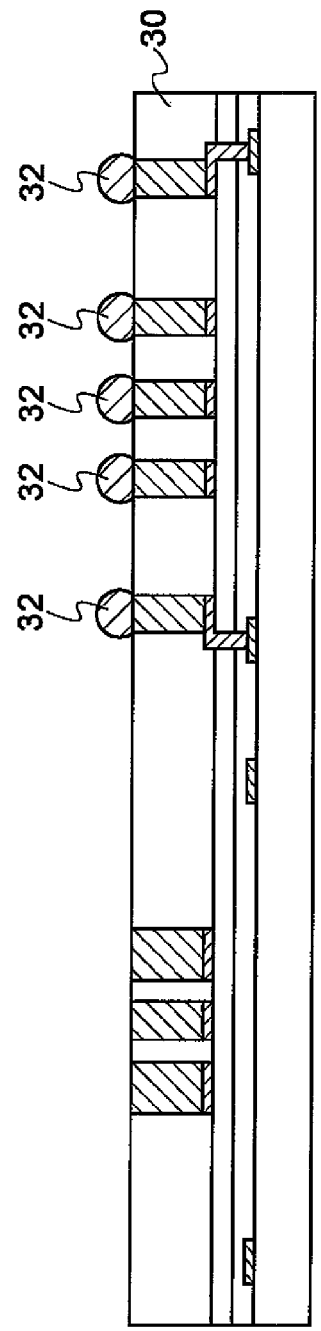

After the above-described process is completed, as shown in FIG. 5(C), for example, an encapsulation film 30 is formed in the alignment mark forming region 14 and the semiconductor element forming region 12 such that the post electrodes 28, the alignment mark 24, and the protection posts 26 are buried and encapsulated in the encapsulation film 30, with the tops of the post electrodes 28, the alignment mark 24, and the protection posts 26 being exposed. The sealing film 30 is formed of an epoxy resin by a sputtering print method or a spin coating method. In the semiconductor element forming region 12, external terminals 32 are provided at the tops of the post electrodes 28. Afterwards, the semiconductor wafer 101 is cut into elements by dicing.

For the semiconductor wafer 101 according to this embodiment as described above, the alignment mark 24 and the protection posts 26 surrounding the alignment mark 24 are disposed in the alignment mark forming region 14. The contact area between the protection posts 26 and the underlayer thereof is greater than the contact area between the alignment mark and the underlayer thereof. As a result, the protection posts 26 are difficult to peel, and therefore, the protection posts 26 sufficiently serve as protective walls to protect the alignment mark. Consequently, the falling off of the alignment mark 24 due to external factors (for example, impacts by wafer tweezers or during transportation) by handling at the time of manufacturing the semiconductor wafer 101 are restrained.

In particular, the semiconductor wafer (see FIG. 1) with the alignment mark 24 being exposed and the protection posts 26 being exposed is often shipped as a product or is often conveyed to an additional line. For this reason, when the semiconductor wafer is shipped or conveyed to an additional line, the semiconductor wafer may be hit due to external factor. Consequently, the semiconductor wafer 101 according to this embodiment is particularly valuable.

Second Embodiment

FIG. 6 is a schematic plan view illustrating an alignment mark forming region of a semiconductor wafer according to a second embodiment of the present invention.

For the semiconductor wafer 102 according to the second embodiment of the present invention, as shown in FIG. 6, a plurality of protection posts 26 are disposed in an alignment mark forming region 14 such that the protection posts 26 surround the alignment mark 24 while the protection posts 26 are over-concentrated on the edge side of the semiconductor wafer 102.

Specifically, among the protection posts 26 provided around the alignment mark 24, those protection posts 26 which are located closer to the edge of the semiconductor wafer 102 have smaller arrangement pitches (arrangement intervals) than those protection posts 26 which are located at the inner side of the semiconductor wafer 102. That is, those protection posts 26 disposed at the edge side of the semiconductor wafer 102 have smaller pitches than those protection posts 26 disposed at the inside of (away from the edge of) the semiconductor wafer 102.

The remaining structure of the semiconductor wafer of this embodiment is the same as that of the first embodiment, and a description thereof will not be given. It should be noted that a manufacturing method of the semiconductor wafer of this embodiment is identical to that of the first embodiment except that the protection posts 26 have different arrangement pitches.

For the semiconductor wafer 102 according to this embodiment as described above, the protection posts 26 are more provided at the edge side of the semiconductor wafer 102 than other areas. Consequently, it is possible for the protection posts 26 according to this embodiment to more effectively serve as protective walls to protect the alignment mark 24 against impacts from the outside of the semiconductor wafer 102, even if the number of the protection posts 26 according to this embodiment is less than or equal to that of the protection posts 26 according to the first embodiment.

It should be noted that although the semiconductor wafer according to any one of the previously described embodiments has a cylinder-shaped alignment mark (column member for alignment mark) 24 and cylinder-shaped protection posts 26, the alignment mark and protection posts may have other shapes (e.g., post having a crisscross cross-sectional shape or a L-shaped cross-sectional shape) as long as the alignment mark and protection pots have a column-shape.

Any one of the previously described embodiments should not be restrictively interpreted, and may be implemented within the scope satisfying the requirements of the present invention.

This application is based on Japanese Patent Application No. 2008-150644, filed on Jun. 9, 2008, and the entire disclosure thereof is incorporated herein by reference.

What is claimed is:

1. A semiconductor substrate comprising:
   a semiconductor substrate main body having a semiconductor element formed therein;
   a columnar member for alignment disposed on the semiconductor substrate main body; and
   a plurality of columnar members for protection disposed on the semiconductor substrate main body such that the columnar members for protection surround the columnar member for alignment, to protect the columnar member for alignment, wherein a contact area between each of the columnar members for protection and an underlayer thereof is greater than a contact area between the columnar member for alignment and an underlayer thereof.

2. The semiconductor substrate according to claim 1, wherein each of the columnar members for protection has a diameter greater than a diameter of the columnar member for alignment.

3. The semiconductor substrate according to claim 2, wherein the diameter of said columnar member for protection is twice the diameter of said columnar member for alignment.

4. The semiconductor substrate according to claim 1, wherein the columnar member for alignment is disposed at an edge side of the semiconductor substrate, and
   the columnar members for protection are disposed around the columnar member for alignment such that those columnar members for protection which are disposed at the edge side of the semiconductor substrate have smaller arrangement pitches than those columnar members for protection which are disposed at an inner side of the semiconductor wafer.

5. The semiconductor substrate according to claim 1, wherein said plurality of columnar members are arranged at equal intervals.

6. The semiconductor substrate according to claim 1, wherein said plurality of columnar members are arranged at different intervals.

7. The semiconductor substrate according to claim 1, wherein eight said columnar members surround said columnar member for alignment.

8. The semiconductor substrate according to claim 1, wherein six said columnar members surround said columnar member for alignment.

9. A manufacturing method of a semiconductor substrate, comprising the steps of:
   preparing a semiconductor substrate main body having a semiconductor element formed therein;
   forming a columnar member for alignment on the semiconductor substrate main body; and
   forming a plurality of columnar members for protection on the semiconductor substrate main body, such that the columnar members for protection surround the columnar member for alignment while a contact area between each of the columnar members for protection and an underlayer thereof is greater than a contact area between the columnar member for alignment and an underlayer thereof, to protect the columnar member for alignment.

10. The manufacturing method according to claim 9, wherein the step of forming the columnar members for protection comprises forming the columnar members for protection such that each of the columnar members for protection has a diameter greater than a diameter of the columnar member for alignment.

11. The manufacturing method according to claim 9, wherein the step of forming the columnar member for alignment comprises forming the columnar member for alignment at an edge side of the semiconductor substrate; and the step of forming the columnar members for protection comprises forming the columnar members for protection such that those columnar members for protection which are formed at the edge side of the semiconductor substrate have smaller arrangement pitches than those columnar members for protection which are disposed at an inner side of the semiconductor wafer.

* * * * *